United States Patent
Koike et al.

(10) Patent No.: US 9,543,376 B2
(45) Date of Patent: Jan. 10, 2017

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Masahiro Koike, Tokyo (JP); Yuuichi Kamimuta, Mie (JP); Tsutomu Tezuka, Ibaraki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/928,341

(22) Filed: Oct. 30, 2015

(65) Prior Publication Data

US 2016/0071921 A1 Mar. 10, 2016

Related U.S. Application Data

(63) Continuation of application No. PCT/JP2014/051967, filed on Jan. 29, 2014.

(30) Foreign Application Priority Data

May 1, 2013 (JP) .................................. 2013-096286

(51) Int. Cl.
*H01L 29/04* (2006.01)
*H01L 21/28* (2006.01)
(Continued)

(52) U.S. Cl.
CPC ....... *H01L 29/045* (2013.01); *H01L 21/02381* (2013.01); *H01L 21/02452* (2013.01);
(Continued)

(58) Field of Classification Search
CPC .... H01L 29/16; H01L 29/78; H01L 21/02452; H01L 21/02532; H01L 21/02381; H01L 21/28518; H01L 21/28052; H01L 29/45; H01L 21/2807; H01L 29/66477

See application file for complete search history.

(56) References Cited

U.S. PATENT DOCUMENTS

| | | | |
|---|---|---|---|
| 2005/0269635 A1* | 12/2005 | Bojarczuk, Jr. | ... H01L 21/28079 257/338 |
| 2011/0089520 A1* | 4/2011 | Lieten | ..................... C30B 23/02 257/472 |

FOREIGN PATENT DOCUMENTS

| | | |
|---|---|---|
| JP | 2008-16798 | 1/2008 |
| JP | 2008-71814 | 3/2008 |
| JP | 2010-171337 | 8/2010 |
| JP | 2012-204648 | 10/2012 |

OTHER PUBLICATIONS

Sn diffusion during Ni germanide growth on Ge1—xSnx Demeulemeester et al., Applied Physics Letters, 99, 211905 (2011), DOI:http://dx.doi.org/10.1063/1.3662925.*

(Continued)

*Primary Examiner* — Jarrett Stark
(74) *Attorney, Agent, or Firm* — Finnegan, Henderson, Farabow, Garrett & Dunner, LLP (57) ABSTRACT

According to one embodiment, a semiconductor device includes a semiconductor layer including Ge; and a metal Ge compound region provided in a surface portion of the semiconductor layer. Sn is included in an interface portion between the semiconductor layer and the metal Ge compound region. A lattice plane of the semiconductor layer matches with a lattice plane of the metal Ge compound region.

11 Claims, 7 Drawing Sheets

(51) Int. Cl.
| | |
|---|---|
| H01L 29/45 | (2006.01) |
| H01L 29/66 | (2006.01) |
| H01L 21/285 | (2006.01) |
| H01L 21/02 | (2006.01) |
| H01L 29/78 | (2006.01) |
| H01L 29/16 | (2006.01) |

(52) U.S. Cl.
CPC .... *H01L 21/02532* (2013.01); *H01L 21/2807* (2013.01); *H01L 21/28052* (2013.01); *H01L 21/28518* (2013.01); *H01L 29/16* (2013.01); *H01L 29/45* (2013.01); *H01L 29/66477* (2013.01); *H01L 29/78* (2013.01)

(56) References Cited

OTHER PUBLICATIONS

Kasahara et al.; "Mechanism of Fermi Level Pinning at Metal/Germanium Interfaces", Physical Review, Review B, vol. 84, pp. 205301-1 to 205301-5 (2011).

Lim et al.; "Fermi-Level Depinning at the Metal-Germanium Interface by the Formation of Epitaxial Nickel Digermanide NiGe2 Using Pulsed Laser Anneal", Applied Physics Letters, vol. 101, pp. 172103-1 to 172103-4 (2012).

Zaima et al.; "Ni Silicide and Germanide Technology for Contacts and Metal Gates in MOSFET Applications", IEEE International Conference on Solid-State and Integrated Technology, 4 (2006).

Lee et al.; "Dynamic Study on Microstructural Evolution of Nickel Germanide Utilizing Zirconium Interlayer", Microelectronic Engineering, vol. 89, No. 23, pp. 23-26 (2012).

International Preliminary Report on Patentability and Written Opinion issued by the International Bureau of WIPO on Nov. 12, 2015, for International Application No. PCT/JP2014/051967.

Office Action, issued by the Taiwan Intellectual Property Office, in a counterpart Taiwan Patent Application No. 103104244, dated Feb. 17, 2016.

English-language International Search Report from the Japanese Patent Office for International Application No. PCT/JP2014/051967, mailing date Apr. 28, 2014.

* cited by examiner

SEMICONDUCTOR DEVICE AND METHOD FOR MANUFACTURING THE SAME

CROSS-REFERENCE TO RELATED APPLICATIONS

This application is a Continuation Application of PCT Application No. PCT/JP2014/051967, filed Jan. 29, 2014 and based upon and claiming the benefit of priority from Japanese Patent Application No. 2013-096286, filed May 1, 2013, the entire contents of all of which are incorporated herein by reference.

FIELD

A present embodiment relates to a semiconductor device including a metal Ge compound layer on a semiconductor layer including Ge as a main component, and also relates to a method for manufacturing the semiconductor device.

BACKGROUND

With regard to a Ge-MOSFET which is expected to be a next-generation device, application of a germanide, such as NiGe, to a metal contact to a source/drain (S/D) or metal S/D has been studied. The germanide is advantageous in that an S/D resistance is lower than that in $n^+$-Ge or $p^+$-Ge formed by high-concentration doping of an impurity and that the germanide can be formed on a Ge layer in a self-aligning manner.

However, in a case of forming a germanide by deposition of a metal on a Ge layer and annealing of the metal and Ge, the germanide is polycrystalline and disadvantageous in that an interface has a low degree of flatness. In the case of Ge nMOSFET with metal S/D, a contact resistance between the germanide S/D and an n-type (or p-type) Ge is increased (or reduced), accordingly, an on (off) current is reduced (or increased).

The reason for this may be that a Fermi level of a germanide is pinned to a charge neutral level near a valence band of Ge (Fermi level pinning: FLP). With increasing of the interface states, the FLP becomes stronger. Therefore, an interface having a high degree of flatness is desirable to lower interface state.

DETAILED DESCRIPTION

In general, according to one embodiment, the semiconductor device includes a semiconductor layer including Ge; and a metal Ge compound region provided in a surface portion of the semiconductor layer, wherein Sn is included in an interface portion between the semiconductor layer and the metal Ge compound region, and a lattice plane of the semiconductor layer matches with a lattice plane of the metal Ge compound region.

Embodiment

Outline

An outline of the present embodiment will be explained, before examples of the present embodiment are explained.

As described above, in a case of forming a compound layer, such as an NiGe layer, on a Ge layer, the NiGe layer is polycrystalline and an interface having low flatness is formed between the Ge layer and the NiGe layer.

The present inventors have studied various methods for growing a single crystal of NiGe at an interface having a high degree of flatness on a Ge layer. As a result, the present inventors conceived a structure including an Sn layer inserted in an interface between Ni and Ge, and discovered that when the structure is subjected to annealing (heat treatment), an NiGe layer having a high degree of interface flatness in a wide range can be epitaxially grown on a Ge layer, as shown in a TEM image (in a cross section) of FIG. 1 and an enlarged view of FIG. 2. For example, when an Ni (10 nm)/Sn (1-5 nm)/Ge(100) structure is subjected to annealing (350° C., 1 min.), a single crystal of NiGe (14 nm) having a high degree of interface flatness is formed. The size of the single-crystal NiGe ranges as wide as 100 nm to 500 nm.

Figure 3:
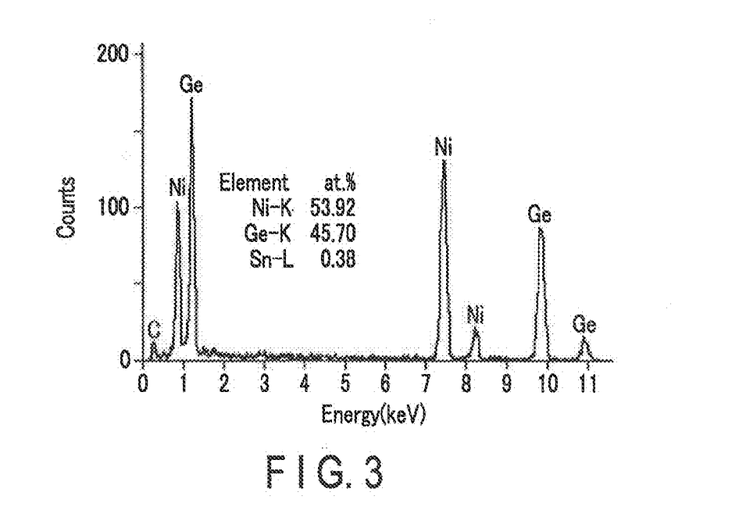
FIG. 3 is a diagram showing a relationship between energy and X-ray intensity analyzed by TEM-EDX.

It was verified, by TEM-EDX (energy dispersive X-ray spectrometry), that the composition ratio of Ni to Ge in the NiGe thus formed was nearly 1:1. For example, FIG. 3 shows a result of an analysis of a composition at point 3 in the TEM image of FIG. 1 (in a cross section). In FIG. 3, a horizontal axis represents energy, and a vertical axis represents an X-ray intensity. At point 3 in the crystal, the contents of Ni and Ge are respectively 53.92 at. % and 45.7 at. %; thus, the ratio thereof is nearly 1. The content of Sn in the crystal is 0.38 at. %, which is negligible.

It was also verified from the TEM image, by fast Fourie transform (FFT), that the NiGe structure formed by the above method was orthorhombic as well as a conventionally formed NiGe structure. Lattice spacings and an angle between lattice planes can be determined from a spot pattern obtained by FFT. As a result, a crystal structure can be identified.

Figure 1:
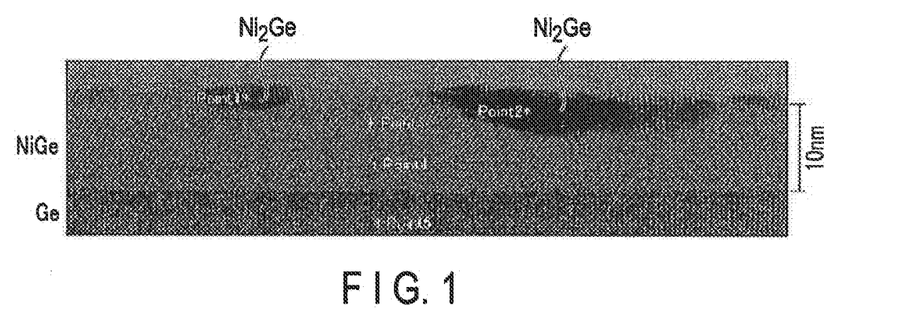
FIG. 1 is a diagram showing a TEM image of NiGe epitaxially grown on a Ge(100) plane and positions of TEM-EDX measurement.
Figure 2:
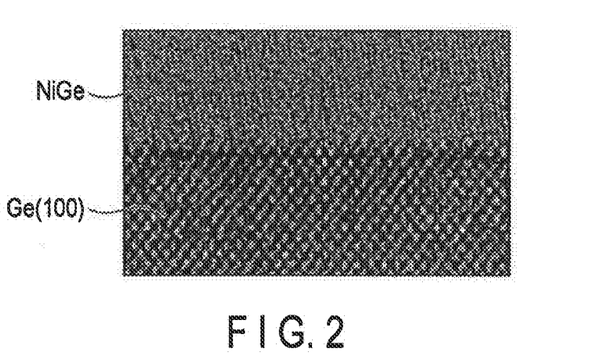
FIG. 2 is an enlarged view of a TEM image of an interface portion between NiGe and Ge shown in FIG. 1.
Figure 4:
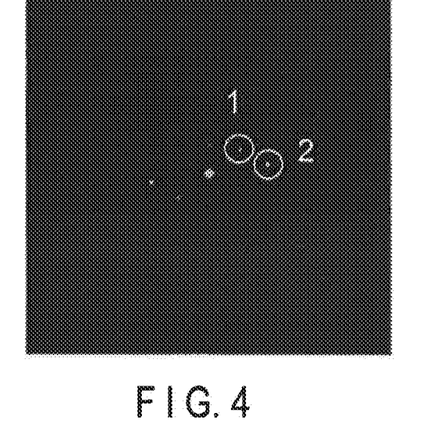
FIG. 4 is a diagram showing a spot pattern by FFT of the TEM image shown in FIG. 1.

For example, a spot pattern as shown in FIG. 4 was obtained by the FFT performed for a position of point 3 shown in FIG. 1. From spots 1 and 2 shown in FIG. 4, it is determined that lattice spacings at the respective spots are 0.296 nm and 0.196 nm and an angle defined by the two planes is 29.0°. With reference to JCPDS database, it was verified that these values correspond to NiGe (orthorhombic), in which Miller indices hkl are 011 and 121, lattice spacings are 0.289 nm and 0.199 nm, and an angle defined by the two planes is 27.6°.

NiGe is epitaxially grown on a Ge(100) plane such that lattice spacing of NiGe matches the lattice spacing of Ge. In the TEM image shown in FIG. 5, for example, there are 68 atoms at an NiGe/Ge interface for 136 stripes observed in a NiGe region. Thus, there are two stripes for one atom. The stripes observed in the NiGe region correspond to a (121) plane of NiGe. As described above, a lattice spacing $d_{121}$ NiGe is 0.199 nm.

Figure 5:
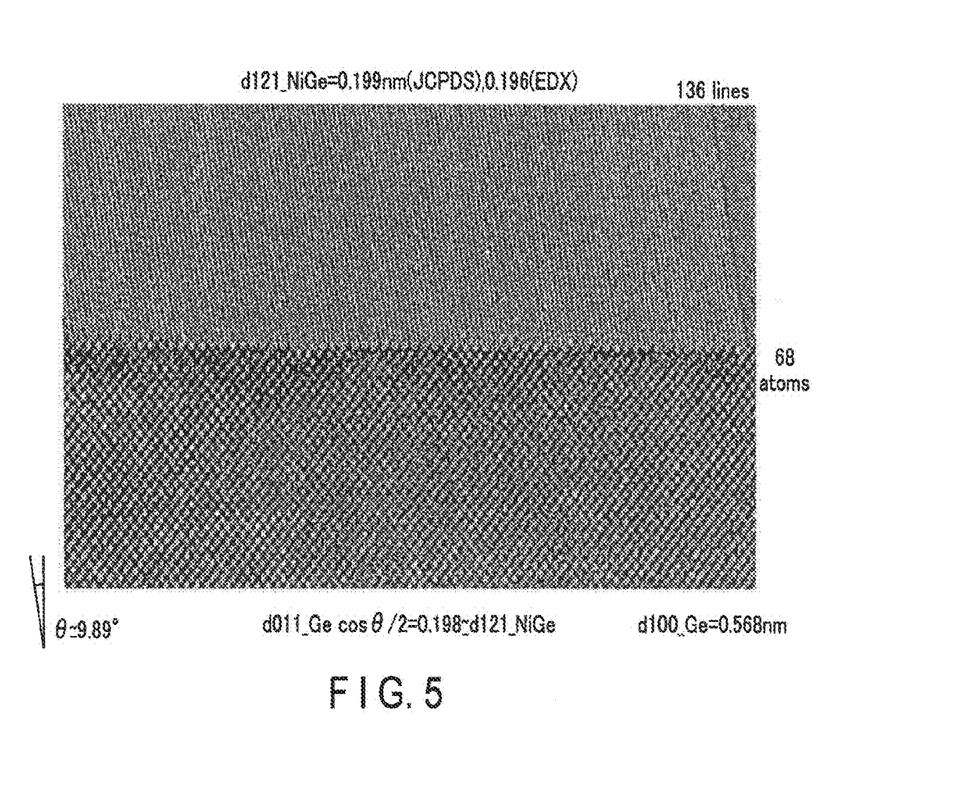
FIG. 5 is a diagram showing a TEM image in which lattices of NiGe and lattices of Ge(100) are formed such that the respective lattice spacings match.

A spacing between atoms at the NiGe/Ge interface corresponds to a spacing $d_{01-1}$Ge on a (01-1) plane of Ge, and the value of the spacing is 0.402 nm. When NiGe/Ge(100) is observed from a <011> direction of Ge (in a vertical direction of the TEM image), an angle θ formed by the Ge(01-1) plane and the NiGe(121) plane is about 9°. From these matters, the relationship represented by the following equation is generally satisfied:

$$d_{01-1}Ge \cos \theta = 2d_{121}NiGe$$

Thus, NiGe is formed on Ge such that the spacing of the NiGe(121) plane matches with the spacing of the Ge(01-1) plane.

The method of the present embodiment is characterized in that NiGe can be epitaxially grown on a Ge(100) plane only by adding an Sn layer at an interface between NiGe and Ge without using a special apparatus.

A prior art document reported that, though not germanide, $Fe_3Si$, for example, is epitaxially grown on a Ge(111) plane (K. Kasahara, S. Yamada, K. Sawano, M. Miyao, and K. Hamaya, Phys. Rev. B 84, 205301 (2011)). In this prior art, a special apparatus called a molecular beam epitaxy (MBE) apparatus is used in a special environment of an ultra-high vacuum of $10^{-7}$ Pa. Therefore, it is difficult to apply the example of the above prior art to actual device development.

The present embodiment is the first that is able to epitaxially grow NiGe, which has the lowest resistance of all various phase structures, on a Ge(100) plane used in a normal semiconductor device, in a wide area of 100 nm to 500 nm.

Another prior art document reported that $Ni_2Ge$ is epitaxially grown on a Ge(100) plane (P. S. Y. Lim, D. Z. Chi, X. C. Wang, and Y.-C. Yeo, Appl. Phys. Lett. 101, 172103 (2012)). When the phase of an NiGe compound becomes Ni-rich, the resistivity of the compound becomes higher. For example, the resistivities of NiGe, $Ni_2Ge$ and $Ni_3Ge$ are about 20μΩcm, 70μΩcm and 80 kΩcm, respectively (see, for example, S. Zaima, O. Nakatsuka, H. Kondo, M. Sakashita, A. Sakai, M. Ogawa, IEEE International Conference on Solid-State and Integrated Circuit Technology, 4 (2006)). According to the results, when a compound of Ni and Ge is applied to a device, NiGe is considered to be most appropriate composition since NiGe is the lowest in resistivity.

Further, J. W. Lee et al., Microelectronic Engineering 89, 23 (2012) discloses that a flat interface is formed by forming NiGe/Ge by annealing of Ni/Zr/Ge, as in the case of using Sn. In a case of using Zr, however, a crystal size is about 100 nm, which is smaller than the crystal size in the case of using Sn (100-500 nm). Since Zr is a metal, if Zr diffuses in Ge, Zr may result in an increase in substrate leakage current. In contrast, Sn used in the present embodiment is a semiconductor in a form of GeSn structure. Since Sn has good compatibility with Ge as to be used together in a device, the presence of Sn will not cause a leakage current.

Figure 6:
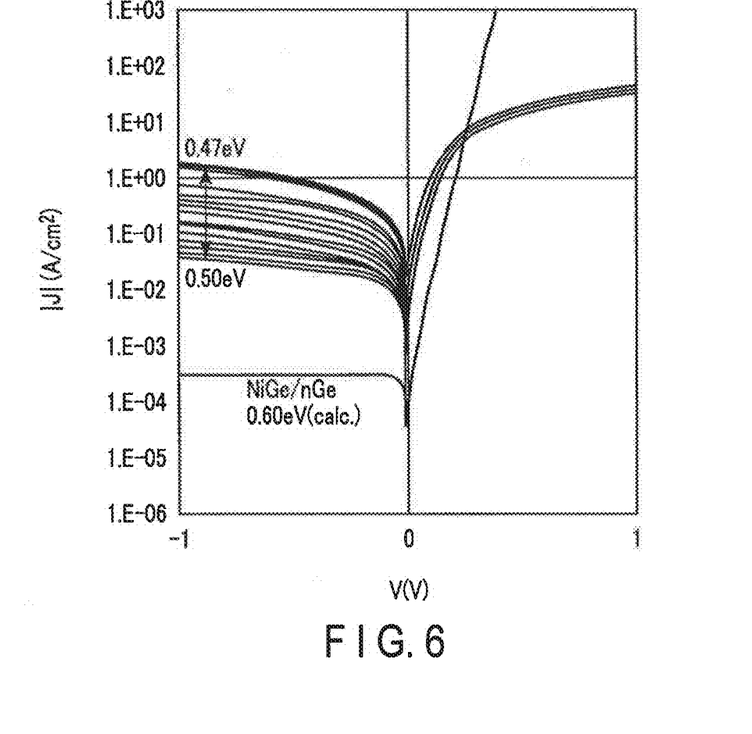
FIG. 6 is a diagram showing current-voltage characteristics of NiGe/nGe.

Thus, it is confirmed that the NiGe layer, formed by annealing of a configuration having an Sn layer interposed at an interface between Ni and Ge, has a lower (higher) contact resistance in the case of n-type (p-type) than a NiGe/Ge formed by the prior art. For example, Sn of 1-5 nm is deposited on an nGe(100) substrate treated with HF. Then, Ni of 10 nm is deposited on Sn. The substrate is subjected to annealing at 350° C. for one minute, so that NiGe is epitaxially grown to form an NiGe/nGe layer. FIG. 6 shows results of measurement of J-V characteristics of the layer. As shown in FIG. 6, it is confirmed that a reverse current at -1V can be increased by roughly two to four orders of magnitude. From the J-V characteristics, a Schottky barrier height (SBH) of NiGe/nGe is estimated at about 0.47-0.5 eV by fitting with a theoretical formula of Shottky currents.

The SBH of NiGe/Ge formed by the prior art is about 0.60 eV. The SBH of an NiGe/nGe diode of the present embodiment is lower than that of the prior art by at least about 0.1 eV. Thus, the contact resistance of the present embodiment is lower as compared to the prior art. The contact resistance of NiGe/Ge can be further reduced by combining the present embodiment with a technique for effectively modulating the SBH, for example, a technique for introducing an n-type dopant, such as P or As, in Ge at the interface to make an $n^+$-Ge area at least around the interface (the concentration of the n-type dopant is at least $1 \times 10^{19}$ cm$^{-3}$).

Reasons why the above effect is obtained by introducing Sn will be described in more detail.

Figure 7:
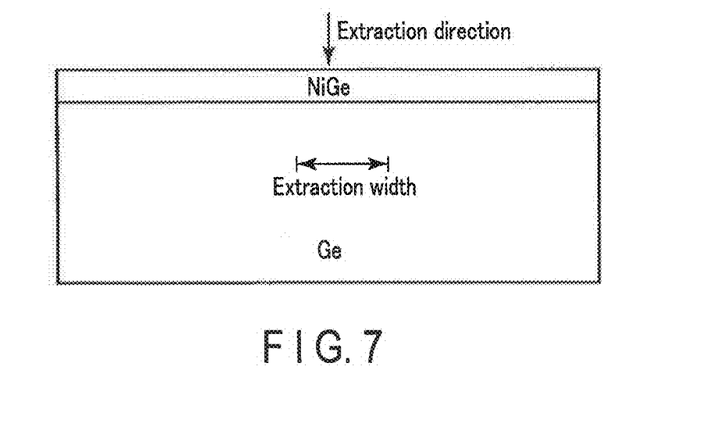
FIG. 7 is a schematic diagram showing a relationship between an extraction direction and an extraction width in an EDX analysis.
Figure 8:
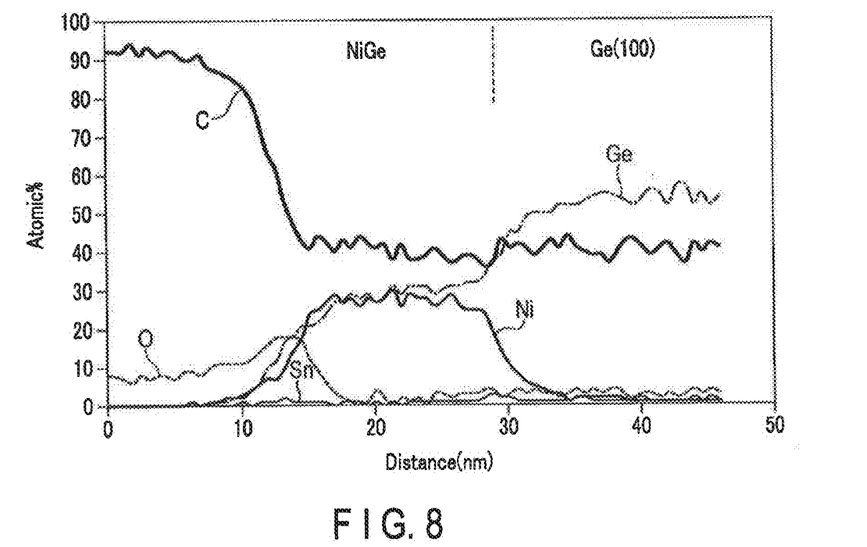
FIG. 8 is a diagram showing a composition distribution by an EDX analysis.

As shown in FIG. 7, a composition of a sample obtained by growing an NiGe layer on a Ge layer by the present embodiment was analyzed by an EDX analysis. FIG. 8 shows a result of the analysis. It is clear that a high percentage of Sn atoms are present around the NiGe/Ge interface. It is also clear that Sn are present near the upper surface of the NiGe layer. C atoms which are present in large amounts are contaminations resulting from electronic irradiation to the sample when the TEM image is observed.

Figure 9:
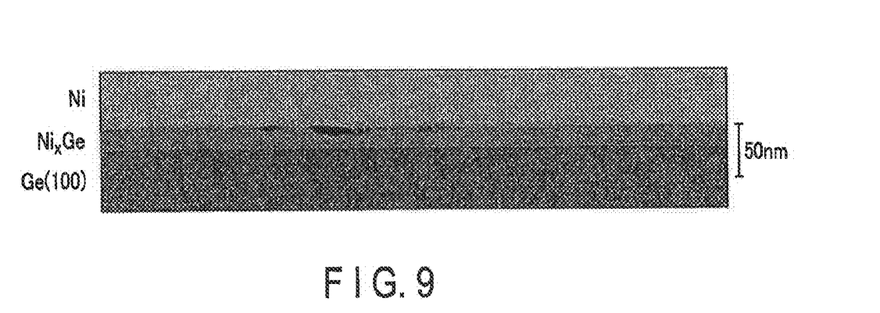
FIG. 9 is a diagram showing a TEM image in a case of forming an NiGe layer on a Ge layer (Ni: 10 nm, Sn: 1 nm).
Figure 10:
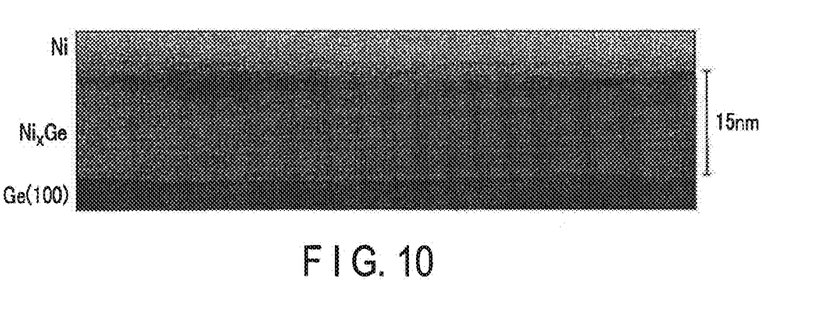
FIG. 10 is a diagram showing a TEM image in a case of forming an NiGe layer on a Ge layer (Ni: 5 nm, Sn: 1 nm).
Figure 11:
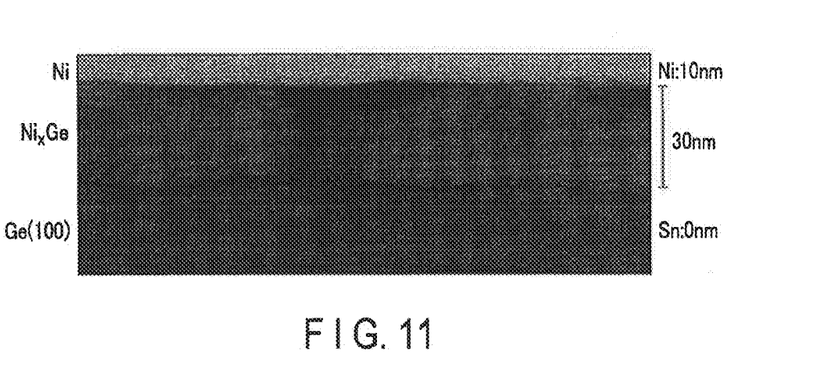
FIG. 11 is a diagram showing a TEM image in a case of forming an NiGe layer without Sn (Ni: 10 nm).

FIG. 9 shows a TEM image of NiGe/Ge in a case of Ni: 10 nm and Sn: 1 nm. The image shows that the interface is flat in a wide range (100-500 nm) and the crystal size is large. FIG. 10 shows a TEM image of NiGe/Ge in a case of Ni: 5 nm and Sn: 1 nm. In this case also, the interface is flat. On the other hand, FIG. 11 shows a TEM image of NiGe/Ge formed in the absence of Sn. In this case, the interface is not flat and the crystal size is small. Thus, it is clear that the flatness of the interface is improved by introducing Sn.

Figure 12:
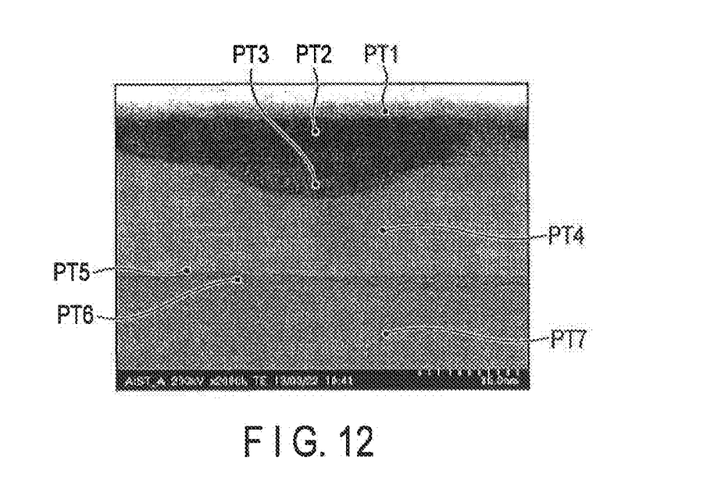
FIG. 12 is a diagram showing a TEM image of an NiGe layer before HCl treatment.
Figure 13:
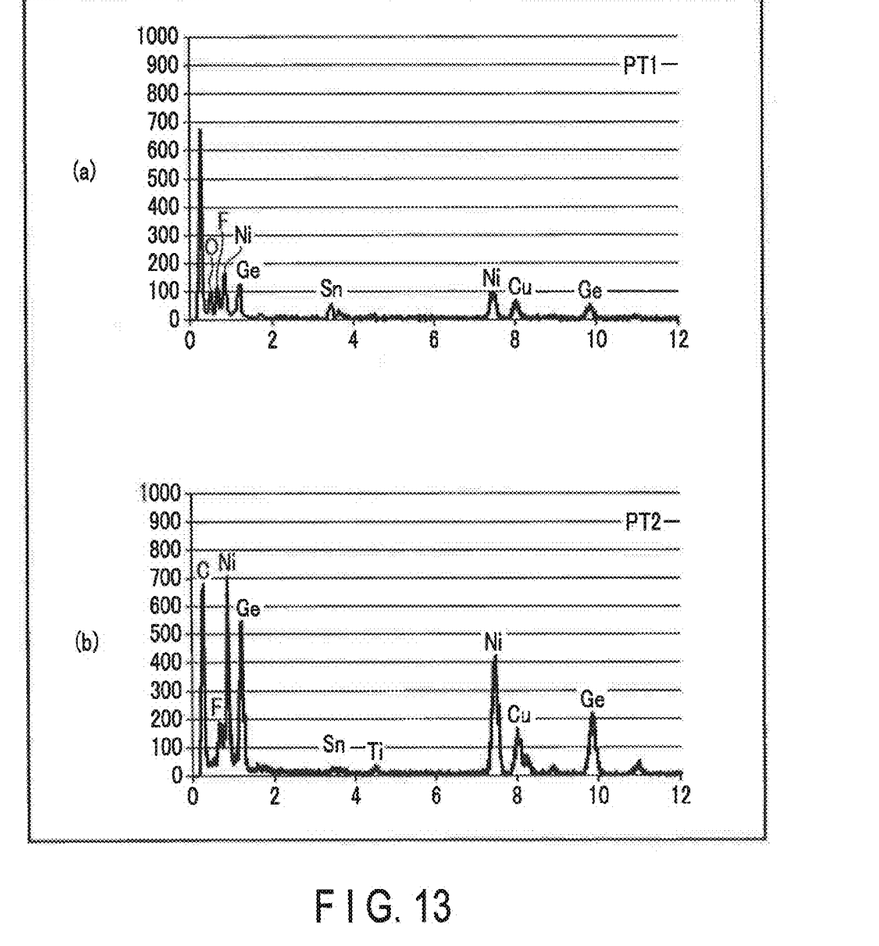
FIG. 13 is a diagram showing composition distributions at analysis points in the NiGe layer shown in FIG. 12.

FIG. 12 shows an NiGe layer formed by a method of the present embodiment before subjecting the surface of the NiGe layer to HCl treatment. Analyses are performed at points PT1, PT2, PT3, PT4, PT5, PT6, and PT7 shown in FIG. 12. Results of analyses at points PT1 and PT2 in FIG. 12 are shown in (a) and (b) of FIG. 13. Sn atoms are present not only at the interface but also in a surface portion of NiGe. The reason is that Ni reacts with Ge through the Sn layer in an Ni/Sn/Ge to form NiGe, and Ni is replaced with Sn, accordingly Sn comes to be present in an uppermost surface portion of NiGe. If HCl treatment is performed to remove unreacted Ni, Sn is removed along with Ni and Ni$_2$Ge that is liable to be formed in an upper portion.

A semiconductor device according to an embodiment will be described with reference to drawings.

Example

Figure 14:
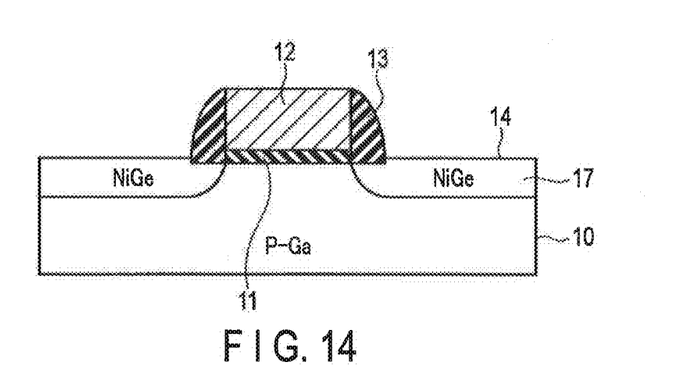
FIG. 14 is a cross-sectional view of a schematic configuration of an NiGe-S/D-Ge-nMOSFET according to the present embodiment.

FIG. 14 is a cross-sectional view of a schematic configuration of an n-type Ge-MOSFET according to an example of the present embodiment.

In FIG. 14, a reference numeral 10 denotes a p-type Ge substrate. A gate electrode 12 is formed on a part of the substrate 10 via a gate insulating film 11. A gate sidewall insulating film 13 is formed on both side surfaces of the gate electrode 12. Al$_2$O$_3$, HfO$_2$, La$_2$O$_3$ and the like or a mixture of any of them may be used as the gate insulating film 11. The gate electrode 12 may be formed of a metal, such as Ta, TaN, Ti, TiN, Ni, Au or Pt, or an alloy, such as NiSix or NiGex, a highly doped poly Si$_{1-x}$Ge$_x$, etc. The gate sidewall insulating film 13 may be formed of a silicon oxide film or a silicon nitride film.

Source/drain (S/D) regions 14 are provided in a surface portion of the substrate 10 and are spaced apart from each other with a channel region interposed therebetween under the gate electrode 12.

Metal contacts including an NiGe layer 17 are formed in S/D regions 14. Sn is contained at the interface between the NiGe layer 17 and the substrate 10. The NiGe layer 17 epitaxially grows on a surface of the substrate.

An NiGe-S/D-Ge-nMOSFET is configured as described above. In a transistor having a gate length of 50 nm, a thickness of S/D in a substrate direction (a direction perpendicular to the surface of the substrate) is about ⅓ (10-20 nm) of the gate length.

A manufacturing process of the embodiment will be described with reference to FIG. 15.

Figure 15:
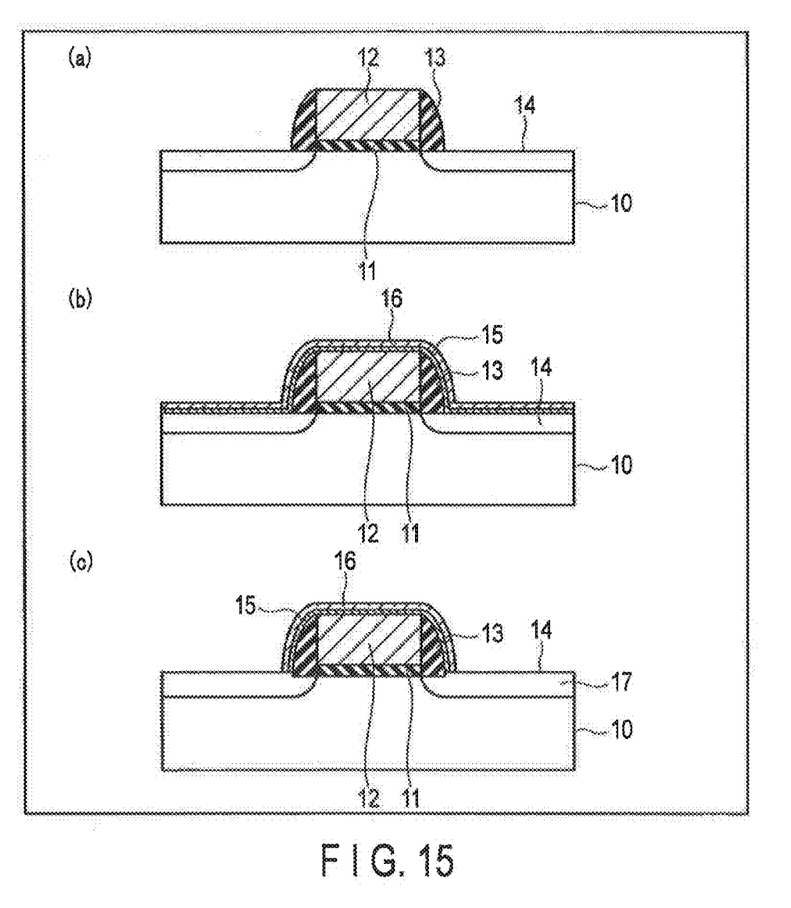
FIG. 15 is a cross-sectional view showing a process of manufacturing the nMOSFET shown in FIG. 14.

First, as shown in (a) of FIG. 15, after the gate electrode 12 is deposited on the gate insulating film 11 on the p-type Ge substrate 10, these materials are processed into a gate pattern. Then, an oxide film is deposited on the entire surface, and thereafter the oxide film is etched back. As a result, the gate sidewall insulating films 13 are formed. Then, an impurity is doped into the substrate, thereby forming n-type source/drain regions 14.

Next, as shown in (b) of FIG. 15, an Sn film 15 of 1-5 nm is deposited by sputtering on the substrate 10 on which a gate portion is formed. In addition, an Ni film 16 of 5-15 nm is deposited on the Sn film 15. The Sn film 15 and the Ni film 16 may be formed only on regions to be source/drain regions on both sides of the gate electrode 12, not the entire surface.

Next, annealing for germanidation is performed at 350° C. for one minute. As a result, NiGe layers 17 are formed in the source/drain regions 14, as shown in (c) of FIG. 15. At this time, the Ni film 16 on the source/drain regions 14 reacts with Ge in the substrate through the Sn film 15. As a result, the NiGe layers 17 are formed in the source/drain regions 14. A small amount of Sn is present at an NiGe/Ge interface and in a surface portion of NiGe. The interface between the NiGe layer 17 and the substrate 10 is flat. The NiGe layer 17 is epitaxially grown.

If the gate electrode 12 is formed of Ge, an NiGe layer can also be formed on the gate electrode 12. If the gate electrode 12 is formed of poly-Si, an NiSi layer can be formed on the gate electrode 12.

Then, an unreacted part of the Ni film 16 is removed and the surface of the NiGe layer 17 is treated with HCl. As a result, the structure shown in FIG. 14 can be obtained.

As described above, according to the embodiment, the structure including the Sn layer inserted in the interface between Ni and Ge is annealed, so that the NiGe layer 17 having a high degree of the interface flatness can be epitaxially grown in a wide range. Therefore, according to the embodiment, the contact resistance between NiGe and Ge can be reduced, and an NiGe-S/D-Ge-nMOSFET with excellent characteristics can be obtained.

Further, the embodiment is advantageous in that the NiGe layer can be epitaxially grown on Ge only by adding a step of forming the Sn layer 15, without using a special apparatus. Furthermore, unlike Zr, Sn is compatible with Ge. Therefore, even if Sn is used to form a metal Ge compound, the presence of Sn will not cause a leakage current. Consequently, the embodiment is very effective for development of a next-generation LSI of a low-power consumption.

Modifications

The present embodiment is not limited to the embodiment described above.

In the embodiment, a bulk Ge substrate is used as a base semiconductor layer. However, the base semiconductor layer is not limited thereto but may be a Ge layer formed on an insulating substrate. Furthermore, the base semiconductor layer is not limited to Ge as a single body, but may be a semiconductor layer containing Ge as a main component, such as a SiGe layer which contains Ge at a high percentage.

In the embodiment described above, NiGe is used for S/D regions of a MOSFET, for example. However, the present embodiment is applicable to a portion where a low resistance NiGe/nGe junction is preferably used. For example, the present embodiment is applicable to a gate electrode of a transistor, a control gate electrode or a floating gate electrode of a non-volatile semiconductor device, or S/D region of a junctionless transistor.

In the embodiment described above, NiGe is annealed at 350° C. for one minute. However, conditions of annealing for germanidation, such as the temperature and time, are not limited, as long as the temperature and time allow formation of NiGe, for example, at 150° C. or higher. The present embodiment can form an NiGe layer of any thickness (for example, 1-100 nm) by changing the thickness of an Ni layer. In the present embodiment, Sn may at least cover the overall surface of Ge.

Although the embodiment has been described for the case of Ge(100), the plane orientation of Ge of the base semiconductor layer is not limited to the (100) plane, but may be the Ge(111) plane or the Ge(110) plane.

In the present embodiment, the metal which is compounded with Ge is not limited to Ni but may be of any other transition metal. For example, Fe, Co, Pd, Pt or Cu, which reacts at a low temperature and forms a germanide of a low resistance, may be used in place of Ni. Two or more metals including Ni and a transition metal may be used to form a germanide.

The present embodiment provides a semiconductor device and a method for manufacturing the same, which can form a monocrystalline layer of a metal Ge compound on a semiconductor layer including Ge as a main component, and can improve flatness of an interface between the metal Ge compound layer and the semiconductor layer.

In the present embodiment, Sn is included in a region between a metal Ge compound layer and a semiconductor layer including Ge as a main component. With this configuration, a monocrystalline layer of a metal Ge compound can be formed on the semiconductor layer and flatness of an interface between the metal Ge compound layer and the Ge layer can be improved. Accordingly, it is possible to improve device characteristics of a semiconductor device including a metal Ge compound layer formed on a semiconductor layer including Ge as a main component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer including Ge; and
a metal Ge compound region provided in a surface portion of the semiconductor layer,
wherein Sn is included in an interface portion between the semiconductor layer and the metal Ge compound region,
a lattice plane of the semiconductor layer matches with a lattice plane of the metal Ge compound region, and
the lattice plane of the semiconductor layer is a (01-1) plane and the lattice plane of the metal Ge compound region is a (121) plane.

2. The device of claim 1, wherein the surface of the semiconductor layer is a (100) plane.

3. The device of claim 1, wherein a concentration of Sn in the interface portion is higher than a concentration of Sn in a portion of the metal Ge compound region except the interface portion.

4. The device of claim 1, wherein the metal Ge compound region includes at least one metal selected from the group consisting of Ni, Fe, Co, Pd, Pt and Cu.

5. The device of claim 1, wherein the surface portion of the semiconductor layer includes an impurity different from a semiconductor material of the semiconductor layer.

6. A semiconductor device comprising:
a first conductivity type semiconductor layer including Ge;
first and second metal Ge compound regions, which are provided in a surface portion of the first conductivity type semiconductor layer and spaced apart from each other; and
a gate electrode provided on a gate insulating film on a region interposed between the first and second metal Ge compound regions in the first conductivity type semiconductor layer,
wherein
Sn is included in interface portions between the first conductivity type semiconductor layer and each of the first and second metal Ge compound regions,
a lattice plane of the first conductivity type semiconductor layer matches with a lattice plane of each of the first and second metal Ge compound regions, and
the lattice plane of the first conductivity type semiconductor layer is a (01-1) plane and the lattice plane of each of the first and second metal Ge compound regions is a (121) plane.

7. The device of claim 6, wherein the surface of the first conductivity type semiconductor layer is a (100) plane.

8. The device of claim 6, wherein concentrations of Sn in the interface portions are higher than concentrations of Sn in portions of the first and second metal Ge compound regions except the interface portions.

9. The device of claim 6, wherein the first and second metal Ge compound regions include at least one metal selected from the group consisting of Ni, Fe, Co, Pd, Pt and Cu.

10. The device of claim 6, wherein the surface portion of the first conductivity type semiconductor layer includes an impurity different from a semiconductor material of the first conductivity type semiconductor layer.

11. The device of claim 6, wherein the first conductivity type semiconductor layer is one of a p-type semiconductor layer and an n-type semiconductor layer.

* * * * *